(12) United States Patent
Smith et al.

(10) Patent No.: US 7,238,579 B2
(45) Date of Patent: Jul. 3, 2007

(54) SEMICONDUCTOR DEVICE FOR REDUCING PHOTOVOLATIC CURRENT

(75) Inventors: Bradley P. Smith, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 206 days.

(21) Appl. No.: 11/003,279

(22) Filed: Dec. 3, 2004

(65) Prior Publication Data
US 2005/0093110 A1   May 5, 2005

(51) Int. Cl.
*H01L 21/8236* (2006.01)
(52) U.S. Cl. ..................... 438/277
(58) Field of Classification Search .............. 257/355, 257/340, 337, 499, 366; 438/275, 277; 716/11, 716/19
See application file for complete search history.

(56) References Cited
U.S. PATENT DOCUMENTS
4,786,611 A * 11/1988 Pfiester ............... 438/233

2001/0052623 A1* 12/2001 Kameyama et al. ........ 257/369
2006/0125017 A1*  6/2006 Liu ........................ 257/365

* cited by examiner

*Primary Examiner*—Nathan W. Ha
(74) *Attorney, Agent, or Firm*—Kim-Marie Vo; James L. Clingan, Jr.; Ranjeev Singh

(57) ABSTRACT

A semiconductor device that has a common border between P and N wells is susceptible to photovoltaic current that is believed to be primarily generated from photons that strike this common border. Photons that strike the border are believed to create electron/hole pairs that separate when created at the PN junction of the border. The photovoltaic current can have a sufficient current density to be destructive to the metal connections to a well if the area of these metal connections to the well is small relative to the length of the border. This photovoltaic current can be reduced below destructive levels by covering the common border sufficiently to reduce the number of photons hitting the common border. The surface area of the connections can also be increased to alleviate the problem.

5 Claims, 2 Drawing Sheets

… (US 7,238,579 B2)

SEMICONDUCTOR DEVICE FOR REDUCING PHOTOVOLATIC CURRENT

FIELD OF THE INVENTION

This invention relates generally to semiconductor devices, and more specifically, to reducing photovoltaic current during semiconductor wafer processing.

BACKGROUND

During semiconductor device processing, metal interconnects can act as either anodes or cathodes of a photovoltaic cell formed in a semiconductor substrate. In the presence of an electrolyte, which occurs during chemical mechanical processing (CMP), electrical current can flow in the photovoltaic cell and causing electrolysis at the surface. Metal interconnects can be oxidized at anodic sites forming ions that may be transported and reduced at cathodic sites. The deposited metal that is reduced at the cathode may grow and form a dendrite. If the dendrites are large enough, they may extend between multiple metal regions and may short the metal regions together. This can cause both yield and reliability problems.

One solution to minimize dendrites is to alter the chemistry of the solutions used during CMP and post-CMP cleaning. While such solutions can be successful in reducing the number of dendrites at the cathodes, they may fail to prevent voids from forming at the anodes. In other words, they fail to prevent current from flowing between the anode and cathode regions.

An approach to minimize electrolysis (i.e., dendrite formation) and corrosion is to polish and scrub wafers in darkness to prevent carrier photogeneration. However, polishing of semiconductor wafers in a dark or dim environment may create difficulties for operators and engineers to see, which increases the risk of accidents.

To enable operators and engineers to see while still minimizing dendritic growth, the windows of CMP tools and/or post-CMP cleaning tools can be covered with a dark or opaque material to prevent light from hitting the wafer when it is wet. However, the dark material on the CMP tools and/or post cleaning tools prevents operators and engineers from viewing the wafer during processing to determine if, for example, a semiconductor wafer has stopped processing or the polishing solution has stopped flowing for unknown reasons. Furthermore, if for some reason it is necessary for the wafer to be removed (e.g., if processing stops because the semiconductor wafer is stuck in the CMP tool), once the door of the CMP tool is opened, dendrites will grow and the semiconductor wafer may suffer reliability problems or yield loss. Therefore, a need exits to overcome the problems of the above processes used to try to minimize dendritic growth.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
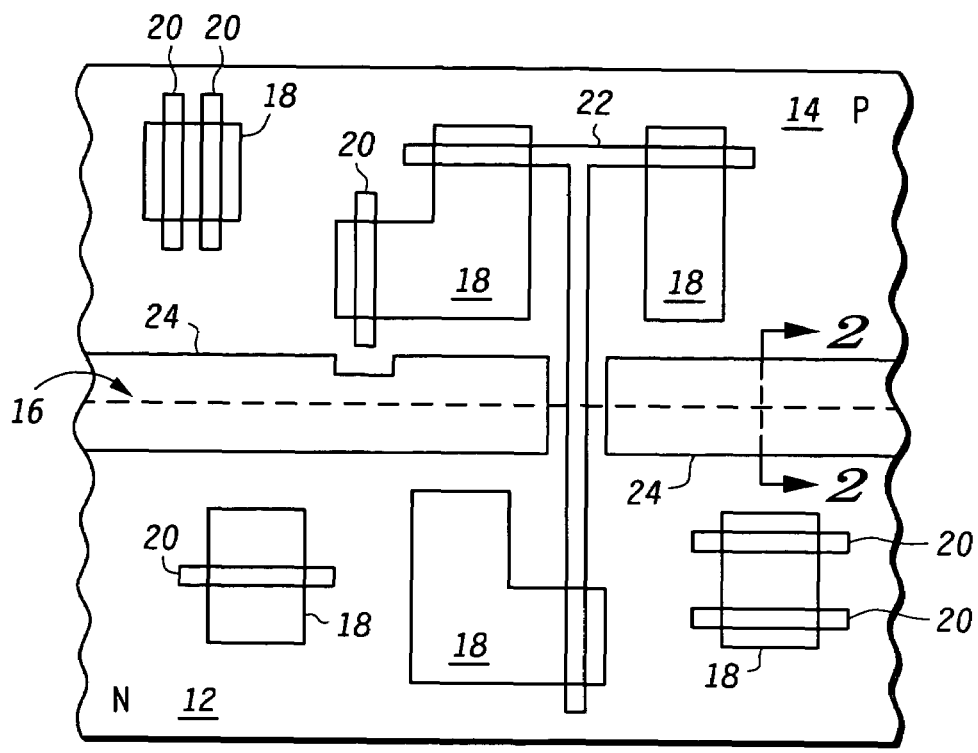
FIG. 1 illustrates a top view of a portion of a semiconductor wafer having a shield pattern to minimize dendritic growth in accordance with an embodiment of the present invention.

Illustrated in FIG. 1 is a top view of a portion of a semiconductor wafer 10 having an N-type well 12 and a P-type well 14 with a common border 16 between them. Active regions 18 are within both the N-type well 12 and the P-type well 14. Gates 20 and 22 are formed over the active regions 18. The portions of the gate electrodes 20 and 22 that overlie the active regions 18 form the gate electrodes of transistors. Each gate electrode 20 and 22 is a continuous portion of a layer that is useful in performing an electrical function. The active regions 18 are doped regions within the N-type well 12 and the P-type well 14 and form the source and drain regions of transistors. Most gate electrodes 20 overlie only one active area or active areas within either the N-type well 12 or the P-type well 14. However a gate electrode, such as the gate electrode 22, may overlie an active region 18 within the N-type well 12 and at least one active region 18 in the P-type well 14.

The regions within the N-type well 12 and the P-type well 14 that are not active regions 18 are the field oxide regions. The formation of the N-type well 12, the P-type well 14, the active regions 18, the field oxide regions, and the gate electrodes 22 are conventional and therefore will not be explained in detail. For example, the N-type well 12 and the P-type well 14 may be formed by ion implantation of either N-type or P-type dopants, respectively. By patterning and etching regions of the semiconductor wafer 10 and then depositing or growing an oxide such as silicon dioxide, the field oxide regions and the active regions 18 are formed. To form the gate electrodes 20, a gate electrode electrode material, which may be polysilicon, tungsten, titanium nitride, titanium tungsten, copper, tungsten silicide, the like and combinations of the above are deposited by chemical vapor deposition (CVD), physical vapor deposition (PVD), electroplating, atomic layer deposition (ALD), the like and combinations of the above. In one embodiment, the layer is then patterned to form the gate electrodes 20 and 22.

When patterning the layer to form the gate electrodes 20 and 22 the mask pattern can be prepared so that material also remains over the common border 16 between the N-type well 12 and the P-type well 14 to form a shield 24, which will be used to substantially block light (e.g., white, ultraviolet, or infrared light) during CMP or any other wet processing.

In one embodiment, a salicide process to form silicide over the gate electrodes 20 and 22 is performed. Any conventional process to form a silicide may be used. It is the silicide, which is a substantially opaque layer, that blocks the majority of the light, not the polysilicon. While polysilicon blocks some light, the thickness of the polysilicon currently used for gate electrode electrodes, which is approximately 150 nanometers, is not thick enough to block enough light. In another embodiment, salicidation is not performed because the gate electrode material is tungsten silicide, which itself is a silicide and is substantially opaque. In yet another embodiment, no silicide is needed because the material used for the gate electrodes 20 and 22 is already a substantially opaque material at the dimension (e.g., thickness) being used (i.e., the gate electrodes 20 and 22 are metals).

The shield 24 can be formed of the same material as the gate electrodes 20 and 22 to decrease processing steps. In one embodiment, the gate electrodes 20 and 22 and the shield 24 are polysilicon. As discussed above, the pattern to form the shield 24 and the gate electrodes 20 and 22 may be on the same mask. It is also possible for the shield 24 to be formed of a different material than that of the gate electrodes 20 and 22. However, additional deposition and patterning steps would be needed, which is undesirable since it increases process complexity and cycle time. In general, the shield 24 can be any material that absorbs infrared, white or ultraviolet light. For example, the shield 24 can be polysilicon or a metal, such as tungsten, titanium, tantalum, the like, or combinations of the above.

The field insulation region is an insulating material, typically silicon dioxide, that is transparent, whereas the N-type well 12 and the P-type well 14 are formed in a semiconductor, such as silicon, which can, through conventional processing, be made substantially opaque and therefore absorb any light incident on it. Light hitting the interface of a P-type well 14 and an N-type well 12, which is under a field insulating region, generates an electron-hole pair. The generated electron travels to the N-type well 12 and the generated hole travels to the P-type well 14, which creates a current. In the presence of an electrolyte (which occurs during wet processes, such as CMP) this current can cause the displacement of metal ions from the anode to the cathode, thereby depleting the anode and forming dendrites on the cathode. By placing a shield 24 that blocks a significant portion of the light from hitting the common border 16, the amount of photocurrent generated is reduced. Therefore, the voids and dendrites are not created, which increases yield and reliability.

To determine parameters of the shield 24 (such as the dimensions, locations, etc.), first a layout of a design of the semiconductor device that has N-type well 12, P-type well 14 and metal connections to the N-type and P-type wells 12 and 14 (not shown) is developed. After developing a first layout, the lengths of uncovered common borders 16 and the total surface areas of the metal connections are determined since the dendritic growth is modulated by the current density at a metal region. More specifically, the propensity to form dendrites is proportional to the length of the exposed (i.e., not covered by a feature at a given processing level) common border 16 between the N-type well 12 and the P-type well 14 divided by the exposed metal area that is coupled to the N-type well 12. In other words, the larger the length of the exposed common border and the smaller the size of an exposed metal area coupled to the N-type well 12, the greater the propensity to form dendrites.

To determine what, if any, design changes are needed, the aforementioned ratio is determined. In order to effectively reduce dendritic growth, it has been empirically determined that the ratio should be less than approximately 1200 per micron if no other method to reduce dendrites is used. However, a higher ratio may be possible if used in conjunction with other methods. If the ratio exceeds the predetermined value for the ratio, which in one embodiment is 1200 per micron, the layout is altered to reduce the ratio and the semiconductor wafer is manufactured using this altered layout. The layout can be altered by increasing the length of the shield 24 or adding additional shields 24. In other words, at least some of the uncovered common border area that was previously is not covered by the shield 24 is covered by the shield 24 after altering the layout. The layout can also be altered by increasing the metal area coupled to the N-type well 12 or the P-type well 14. In one embodiment, the total length of the shield 24, which can be a continuous shield or various shields, overlies at least fifty percent (50%), or more preferably at least seventy percent (70%), or most preferably at least ninety percent (90%) of the common border 16 and the remainder of the common border is exposed.

However, a higher ratio than 1200 per micron may be possible if used in conjunction with other methods. Hence, the total length of the exposed common border may be increased if the shield 24 is used in conjunction with other methods to decrease dendritic growth. In other words, the length of the shield 24 may decrease when multiple solutions are used in conjunction with each other to minimize dendritic growth.

To diminish the electrical impact of the shield 24 on the gate electrode electrodes 20 and 22, it may be necessary to adjust the shape of the shield 24. As shown in FIG. 1, a notch 25 is formed in a portion of the shield 24 and gaps 27 are formed between the gate electrode electrode 22 and the shield 24 in order to decrease such impact.

Figure 2:
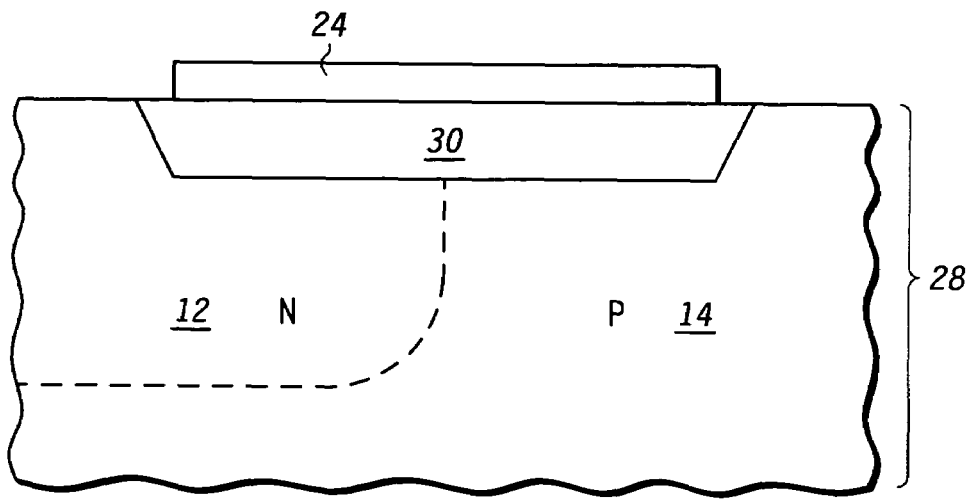
FIG. 2 illustrates a cross-section of a portion of FIG. 1.

FIG. 2 is a cross-section of a portion of the semiconductor wafer 10 shown in FIG. 1 taken across a portion of the shield 24. As previously discussed a field isolation region 30 is formed over the N-type well 12 and the P-type well 14. The shield 24 overlies the common border 16 and portions of the field isolation region 30 which do not overlie the common border 16, in order to block any light that is incident on the semiconductor wafer 10 at an angle. In other words, the wider the shield 24 (i.e., the more area of the field isolation region 30 that is covered by the shield 24) the less light that will impact the common border 16 and therefore the weaker the current in the semiconductor wafer 10 (i.e., the photovoltaic cell). The decreased current decreases the current density and thus, dendritic growth.

It is desirable that the shield 24 is as wide as possible to block the most amount of light. However, the edges of the shield 24 should overlie the trench isolation region 30 and not either of the active regions in N-type well 12 or the P-type well 14 to avoid electrically coupling the shield 24 to the N-type well 12 or the P-type well 14. If the shield 24 is coupled to the N-type well 12 or the P-type well 14, it will also be coupled to the transistors forming in the wells. The width of the shield 24 may also be constrained if there are gate electrodes near the trench isolation region 30. As previously discussed in regards to FIG. 1, a notch was formed in the shield (i.e., the width of the shield was decreased) to avoid negatively impacting the electrical performance of a gate electrode 20.

Figure 3:
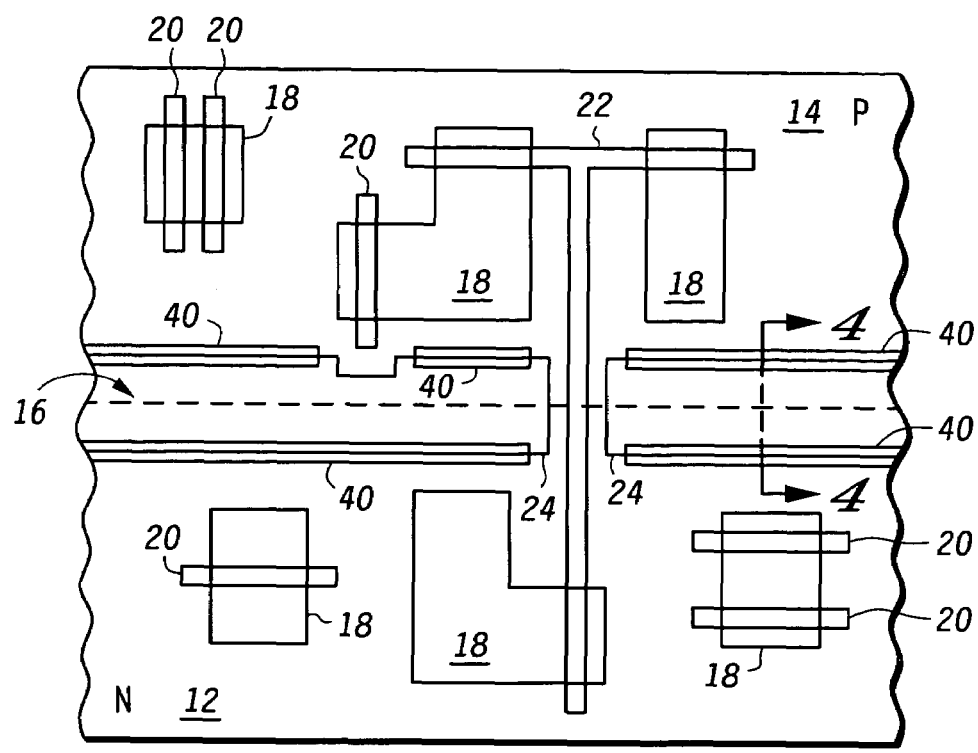
FIG. 3 illustrates a top view of a portion of the semiconductor wafer of FIG. 1 with additional active regions to minimize dendritic growth in accordance with another embodiment of the present invention.

To decrease the width of the shield 24, dummy active regions 40 can be formed in the N-type well 12 and the P-type well 14 near the common border 16 and in what otherwise would be the field isolation region, as shown in FIG. 3. The formation of the dummy active regions 40 can be formed by changing the design of the field isolation regions on the mask used for patterning. The dummy active regions 40 are formed using the same processes to form the active regions 18.

Figure 4:
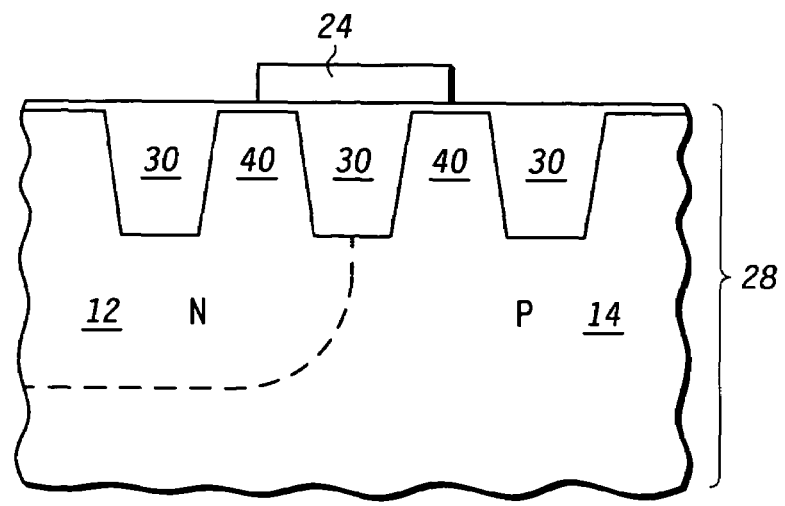
FIG. 4 illustrates a cross-section of a portion of FIG. 3.

FIG. 4 is a cross-section of a portion of the semiconductor wafer 10 shown in FIG. 3 taken across a portion of the shield 24. The dummy active features 40 are separated from each other by the field insulating regions 30 that overlie the common border 16. However, some field insulating regions 31 are not on the common border 16. In one embodiment, for at least fifty percent (50%) of the length of the common border 16, each of the dummy active features 40 are adjacent to the common border.

Due to the presence of the dummy active features 40, the width of the field insulating region 30 over the common border is decreased. If the dummy active features 40 were not formed, the field insulating region 30 would be as wide as itself plus the widths of the dummy active features 40 and the field insulating regions 31. Any light that enters the field insulating regions 31 will not be transmitted to the common border because the N-type well 12 or P-type well 14 and/or the dummy active features 40 are block the light to the common border 16. Therefore, the width of the shield 24 need only be wide enough to cover at least the field insulating region 30. In this embodiment, since the dummy active regions 40 serve no electrical purpose for the functioning of a semiconductor device, it does not matter if the shield 24 or its edges overlie either or both of the dummy active features 40, as shown in FIG. 4.

If the shield 24 exposes portions of the dummy active feature 40, the exposed portions will be silicided if a salicidation process is performed. Since the silicide formed over the dummy active features 40 is substantially opaque, it will also help prevent any incident light on the silicide from penetrating the active dummy active feature 40 where it would be absorbed. In addition, the edges of the shield could overlie the field isolation regions 31, which themselves do not overlie the common border 16. Light incident on the field isolation regions 31, will be absorbed by the dummy active features 40, the N-type well 12 or the P-type well 14 and will not travel to the common border 16.

By now it should be appreciated that there has been provided a semiconductor device that reduces photovoltaic current by having a shield 24 formed overlying a common border between an N-type well and a P-type well. Optionally, dummy active features in the field isolation region may overlie the common border and be located under the shield 24. The presence of the shield minimizes the current that can flow between the anode (conductive areas coupled to the P-type well) and the cathode (conductive areas coupled to the N-type well) when the semiconductor wafer is in contact with an electrolyte. The decrease in current minimizes the formation of voids and dendrites, which increase reliability and decreases yield loss. The shields and the dummy active features, if present, can be formed without any additional processing steps. Instead, only the pattern of the layers in a mask needs to be changed. The lights in the fabrication environment do not need to be dimmed or turned off, which alleviates the problem of operators or engineers not being able to see sufficiently. In addition, when using the shield if a semiconductor wafer needs to be removed from a processing tool, such as a CMP tool or post-CMP cleaning tool (e.g., scrubber), for any reason, the light in the fabrication environment should not sufficiently decrease reliability or yield loss. Therefore, it is not necessary to cover the windows of the tools with a dark or an opaque material.

In the foregoing specification, the invention has been described with reference to specific embodiments. However, one of ordinary skill in the art appreciates that various modifications and changes can be made without departing from the scope of the present invention as set forth in the claims below. For example, a replacement dummy gate electrode process can be used to form the gate electrodes 20 and 22 and, optionally, the shield 24. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed. Furthermore, the same numbers in various figures denote the same structures.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The term coupled, as used herein, is defined as connected, although not necessarily directly, and not necessarily mechanically.

What claimed is:

1. A method of making a semiconductor device, comprising:
    developing a first layout of a design of the semiconductor device having wells of first conductivity type, wells of a second conductivity type, and metal connections to the wells of the first and second conductivity type;
    determining lengths of uncovered common borders between the wells of the first and second conductivity types;
    determining total surface areas of the metal connections;
    for each well determining the ratio of the length of the uncovered common border for that well to the total surface area of the metal connections to that well;
    if the ratio exceeds a predetermined value for a particular well, altering the first layout to a second layout to reduce the ratio for the particular well below the predetermined value; and
    manufacturing the semiconductor device according to the second layout.

2. The method of claim 1, wherein the altering the first layout is to cover at least some of the uncovered common border of the first layout for the particular well.

3. The method of claim 1, wherein the altering the first layout is to increase the total surface area of the metal connections to the well.

4. A method of making a semiconductor device, comprising:
    providing a semiconductor substrate;
    forming a first region of a first conductivity type in the substrate;

forming a second region of a second conductivity type in the substrate having a common border with the first region;

forming an isolation region in the substrate at the common border having a first portion in the first region and a second portion in the second region;

forming a substantially opaque layer over the substrate; and patterning the substantially opaque layer to leave gates and shields, and wherein one or more of the shields cover at least a fifty percent of the common border, and wherein the one or more of the shields comprises a notch.

5. The method of claim 4, wherein the one or more shields cover at least ninety percent of the common border.

* * * * *

UNITED STATES PATENT AND TRADEMARK OFFICE
CERTIFICATE OF CORRECTION

| | | |
|---|---|---|
| PATENT NO. | : 7,238,579 B2 | Page 1 of 1 |
| APPLICATION NO. | : 11/003279 | |
| DATED | : December 3, 2004 | |
| INVENTOR(S) | : Bradley P. Smith | |

It is certified that error appears in the above-identified patent and that said Letters Patent is hereby corrected as shown below:

In Column 8, Line 2, Claim 4;

Change "and shields, and wherein one" to --and shields, wherein one--

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 7,238,579 B2  Page 1 of 1
APPLICATION NO. : 11/003279
DATED : July 3, 2007
INVENTOR(S) : Bradley P. Smith It is certified that error appears in the above-identified patent and that said Letters Patent is hereby corrected as shown below:

In Column 8, Line 2, Claim 4;

Change "and shields, and wherein one" to --and shields, wherein one--

This certificate supersedes the Certificate of Correction issued July 22, 2008.

Signed and Sealed this

Twelfth Day of August, 2008

JON W. DUDAS
*Director of the United States Patent and Trademark Office*